United States Patent
Brady et al.

(10) Patent No.: US 9,582,410 B2
(45) Date of Patent: Feb. 28, 2017

(54) TESTING SOFTWARE ON A COMPUTER SYSTEM

(75) Inventors: Mark Brady, Manchester (GB); Aled A. Griffiths, Manchester (GB); Joel M. Keeble, Manchester (GB); Michael O'Connor, Manchester (GB)

(73) Assignee: International Business Machines Corporation, Armonk, NY (US)

( * ) Notice: Subject to any disclaimer, the term of this patent is extended or adjusted under 35 U.S.C. 154(b) by 1172 days.

(21) Appl. No.: 13/281,478

(22) Filed: Oct. 26, 2011

(65) Prior Publication Data
US 2012/0123761 A1 May 17, 2012

(30) Foreign Application Priority Data
Oct. 27, 2010 (EP) .................................. 10189073

(51) Int. Cl.
| | |
|---|---|
| G06F 11/36 | (2006.01) |
| G06Q 10/06 | (2012.01) |
| G06F 17/50 | (2006.01) |
| G06Q 10/10 | (2012.01) |

(52) U.S. Cl.
CPC ...... *G06F 11/3696* (2013.01); *G06F 11/3676* (2013.01); *G06F 11/3684* (2013.01); *G06F 17/5022* (2013.01); *G06Q 10/06* (2013.01); *G06Q 10/0639* (2013.01); *G06Q 10/1097* (2013.01)

(58) Field of Classification Search
None
See application file for complete search history.

(56) References Cited

U.S. PATENT DOCUMENTS

| | | | | |
|---|---|---|---|---|
| 5,541,862 | A * | 7/1996 | Bright et al. ................. | 702/122 |
| 5,710,934 | A * | 1/1998 | Bona et al. ................... | 714/724 |
| 6,389,379 | B1 * | 5/2002 | Lin et al. ....................... | 703/14 |
| 6,574,760 | B1 * | 6/2003 | Mydill ........................ | 714/724 |
| 6,678,643 | B1 * | 1/2004 | Turnquist et al. ............. | 703/14 |
| 6,834,359 | B2 * | 12/2004 | Boehm et al. ................. | 714/28 |
| 7,047,463 | B1 * | 5/2006 | Organ et al. .................. | 714/724 |
| 7,089,534 | B2 * | 8/2006 | Hartman et al. .............. | 717/125 |
| 7,181,382 | B2 | 2/2007 | Shier et al. | |
| 7,340,386 | B2 * | 3/2008 | Pal et al. ........................ | 703/14 |
| 7,486,096 | B2 * | 2/2009 | Dhong et al. .............. | 324/750.3 |
| 7,904,289 | B2 * | 3/2011 | Ambilkar et al. ............. | 703/27 |
| 8,010,933 | B2 * | 8/2011 | Hildebrant .................... | 716/136 |

(Continued)

OTHER PUBLICATIONS

IBM TDB, IPCOM000118052D, "Software Test Coverage Measurement," Aug. 1, 1996, vol. 39, No. 8, pp. 223-226.

*Primary Examiner* — Kibrom K Gebresilassie
(74) *Attorney, Agent, or Firm* — Roy W. Truelson; James R. Nock

(57) ABSTRACT

A method is provided for testing a computer system, which system includes an interface supporting connection to one or more hardware devices. The method comprises initially performing a plurality of discrete software test processes in a first order of performance. For each test process, by reference to the said interface, the hardware device interactions occasioned by each said test process are recorded. Subsequently the said test processes are run in a second order of performance, which second order is derived from the record of hardware device interactions. A computer system configured to implement the method is also provided.

14 Claims, 5 Drawing Sheets

(56) References Cited

U.S. PATENT DOCUMENTS

| | | | |
|---|---|---|---|
| 8,479,172 B2* | 7/2013 | Duale et al. | 717/134 |
| 8,495,583 B2* | 7/2013 | Bassin et al. | 717/127 |
| 2004/0039966 A1* | 2/2004 | Petsinger et al. | 714/28 |
| 2004/0088150 A1 | 5/2004 | Gay | |
| 2004/0205570 A1* | 10/2004 | Tonomura | 715/513 |
| 2005/0193355 A1* | 9/2005 | Hildebrant et al. | 716/6 |
| 2005/0229121 A1* | 10/2005 | Hildebrant | 716/4 |
| 2006/0253812 A1* | 11/2006 | Hildebrant | 716/4 |
| 2006/0271822 A1* | 11/2006 | Pal et al. | 714/30 |
| 2007/0239959 A1 | 10/2007 | Papineau | |
| 2008/0010535 A1* | 1/2008 | Dasgupta | 714/38 |
| 2008/0100328 A1* | 5/2008 | Dhong et al. | 324/765 |
| 2009/0070633 A1* | 3/2009 | Staneff | 714/45 |
| 2009/0199047 A1* | 8/2009 | Vaitheeswaran et al. | 714/47 |
| 2009/0199160 A1* | 8/2009 | Vaitheeswaran et al. | 717/124 |
| 2009/0307763 A1* | 12/2009 | Rawlins et al. | 726/5 |
| 2009/0328017 A1* | 12/2009 | Larsen et al. | 717/146 |
| 2011/0296383 A1* | 12/2011 | Pasternak | 717/124 |
| 2012/0042210 A1* | 2/2012 | Glaser et al. | 714/38.1 |
| 2013/0042151 A1* | 2/2013 | McCoy et al. | 714/38.1 |

\* cited by examiner

| TEST # | DEVICE # | COVER Y/N | RESULT |
|---|---|---|---|
| 1 | 1 | 0 | 00000000 |
| 1 | 2 | 1 | 10110011 |
| 1 | 3 | 0 | 00000000 |
| 2 | 1 | 1 | 01101111 |
| 2 | 2 | 0 | 00000000 |
| 2 | 3 | 1 | 10011100 |
| 3 | 1 | 1 | 01101110 |
| 255 | 3 | 0 | 00000000 |
| 256 | 1 | 0 | 00000000 |
| 256 | 2 | 1 | 00111011 |
| 256 | 3 | 1 | 11100100 |

FIG. 5

TESTING SOFTWARE ON A COMPUTER SYSTEM

FIELD OF THE INVENTION

The present invention relates to methods for testing of software running on computer systems, which systems interface with one or more hardware devices. Additionally the invention relates to software utilities for implementing such methods, and also to computer systems configured to implement those methods.

BACKGROUND ART

As will be readily understood by those of ordinary skill in the art, software in current computer systems is an integral feature and ensuring that it functions correctly is an essential step in the bringing to market of such systems. There are many and varied technologies and schemes for the testing and development of software, and those relating to interaction of such systems with associated hardware are of particular consideration here.

U.S. Pat. No. 7,181,382B2 (Shier et al) describes a system for the testing and modelling of hardware as part of a software test function. A device simulation framework bridges user address space and kernel space. In kernel space, the simulation framework links to both actual hardware device drivers and device simulator drivers whereby testing may be carried out by reference to both actual and simulated hardware interactions. In user address space the device simulation framework links to a test application specifying the hardware tests to be carried out. In short, the device simulation framework provides a two way communications link between the user address and kernel spaces and enables the test application to log the outcome of each hardware test operation, for example by recording and time-stamping. A further example of a software test system supporting interaction between a test application and a software simulation of hardware is described in United States patent application 2004/0088150 (Gay).

One consideration in any software testing methodology is the efficiency of the test, and one aspect of this to ensure that the so-called structural coverage of the software under test is complete, that is to say to ensure that all branches and conditional features of the software are tested. Example systems for optimising test coverage are described in IBM Technical Disclosure Bulletin Vol. 39 No. 8 Aug. 1996 at pp. 223-225 and in United States patent application 2007/0239959 (Papineau).

A further consideration is the efficiency of operation in relation to desired outcome. A software test application may comprise a suite containing hundreds or even thousands of individual test processes developed to ensure full structural coverage. Requiring the full suite to be run repeatedly, for example after each bug-fix, is expensive both in processing resources and in development time for the system as a whole.

As will be readily understood from the foregoing, a need exists for methods and computer systems that improve the efficiency of testing of software applications.

SUMMARY OF THE INVENTION

In accordance with a first aspect of the present invention there is provided a method for testing a computer system, which system includes an interface supporting connection to one or more hardware devices, comprising the steps of:

performing a plurality of discrete software test processes in a first order of performance;
for each test process, by reference to said interface, recording the hardware device interactions occasioned by each said test process;

wherein the method further comprises:
subsequently running at least some of said test processes in a second order of performance, which second order is derived from said recording of hardware device interactions.

By deriving a second order of performance based on the recorded hardware device interactions, the efficiency of testing may be improved. For example, when testing the operation in relation to a specific hardware device or feature thereof, possibly following the fixing of an error or defect detected in a previous test, the second order has those test processes which occasion interactions with the specific device or feature at or as near to the start as practicable, such as to prioritise the testing on the basis of finding the defect. In this way, any ongoing problems with the particular hardware device may be detected relatively quickly, that is to say without having to run the full set of test processes.

It should be noted that the term "hardware" as used herein refers to both external devices, such as computer peripherals to which the system may be connected, and internal devices such as memories and coprocessors. In the case of external devices, the interface may comprise a suitable device driver hosted by the system. For internal devices the interface may comprise those features enabling interconnection of the devices, for example via data and address buses.

A further benefit accrues where the plurality of test processes have been developed over time, with new tests simply being added to the end of an existing suite of tests. Those of the tests affecting an individual piece of hardware may thereby be distributed throughout the first order of test process performance, necessitating the running of the full suite of test processes to ensure full coverage for that individual piece of hardware. By application of the present invention, those tests are pulled together in the re-ordered performance order resulting in reduced time required to fully test that piece of hardware.

In the above method the said plurality of discrete software processes may be directed by a test application operating in user address space of the said computer system and the said hardware device interactions may be detected from monitoring activity in kernel address space of said computer system. In such a method, the or each hardware device may be associated with one or more respective specific locations in kernel address space and the step of recording the hardware device interactions then comprises logging accesses to the or each of said one or more specific locations.

Optionally, in a method according to the invention, the step of recording the hardware device interactions for each test process may further comprise determining and recording a respective coverage value representing the extent of hardware device interactions and, in such a case, the said second order of performance may comprise a schedule of said test processes in order from greatest to lowest respective coverage values.

Also in accordance with the present invention there is provided a computer system comprising:
a processor operable to perform a plurality of discrete software test processes in a first order of performance;
a memory connected to said processor and storing operating instructions for said processor;
an interface coupled with said processor and supporting connection to one or more hardware devices;

said processor being controlled to perform the functions of:
recording in said memory for each test process, by reference to said interface, the hardware device interactions occasioned by each said test process;
determining a second order of performance for said software test processes, which second order is derived from said recording of hardware device interactions; and
running at least some of said test processes in said second order of performance.

In such a system, the said plurality of discrete software test processes performed by said processor may suitably be directed by a test application operating in user address space, and the or each hardware device to which connection is supported may suitably be associated with one or more respective specific locations in kernel address space, with said processor being configured to record said hardware device interactions by logging accesses to the or each of said one or more respective specific locations in kernel address space of said computer system.

Advantageously, the said interface supporting connection to one or more hardware devices may comprise a discrete interface module in kernel address space and associated with each hardware device supported. Alternatively, or additionally, the said interface may comprise an interface to one or more hardware device simulations modelled in kernel address space.

The invention further provides a computable-readable medium containing computer-readable instructions which, when executed by a computer system performs a method according to the invention and as described above.

The summary of the present invention does not recite all the necessary features of the invention, and sub-combinations of those features may also encompass the invention.

BRIEF DESCRIPTION OF THE DRAWINGS

FIG. 5 represents a table storing results of an example test application.

DETAILED DESCRIPTION

Figure 1:
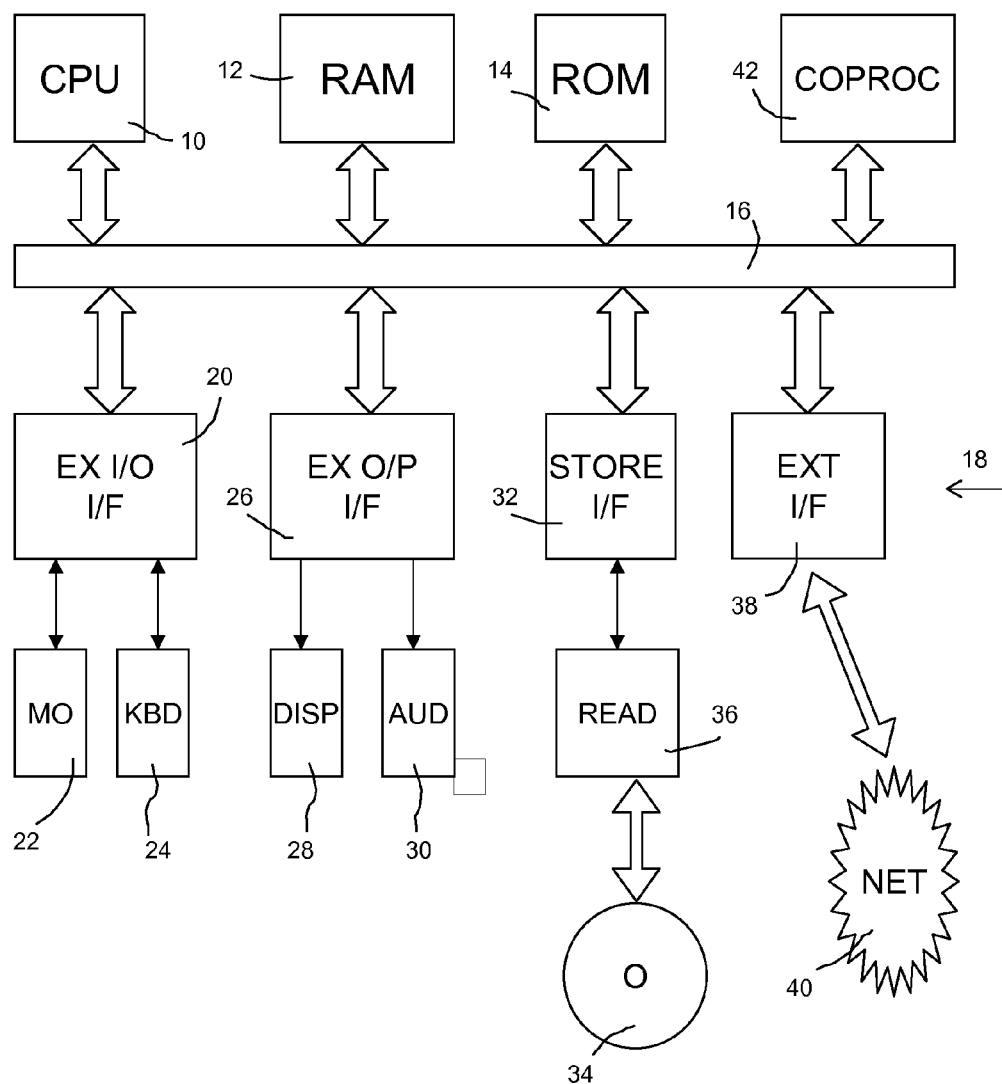
FIG. 1 is a block diagram showing components of a computer system suitable for implementing the method and system of the present invention.

FIG. 1 schematically represents the components of a computer system suitable to embody the present invention. A processor CPU 10 is coupled with random access memory RAM 12 and read only memory ROM 14 by an address and data bus 16. Also connected to CPU 10 via the address and data bus 16 is a coprocessor device 42 supplementing the function of the CPU 10, handling processes such as floating point arithmetic, graphics processing, signal processing and encryption. Each of these internal hardware devices 10, 12, 14, 42 includes a respective interface (not shown) supporting connection to the bus 16. These interfaces are conventional in form and need not be described in further detail Also connected to the CPU 10 via bus 16 are a number of external hardware device interface stages (generally denoted 18). A first interface stage 20 supports the connection of external input/output devices, such as a mouse 22 and/or keyboard 24. A second interface stage 26 supports the connection of external output devices such as a display screen 28 and/or audio output device 30, such as headphones or speakers. A third interface stage 32 supports the connection to external data storage devices in the form of computer readable media: such external storage may as shown be provided by a removable optical or magnetic disc 34 (accessed by a suitably configured disc reader 36). Alternatively or additionally the external storage may be in the form of a solid state memory device such as an extension drive or memory stick. A fourth interface stage 38 supports connection of the system to remote devices or systems via wired or wireless networks 40, for example over a local area network LAN or via the internet.

Figure 2:
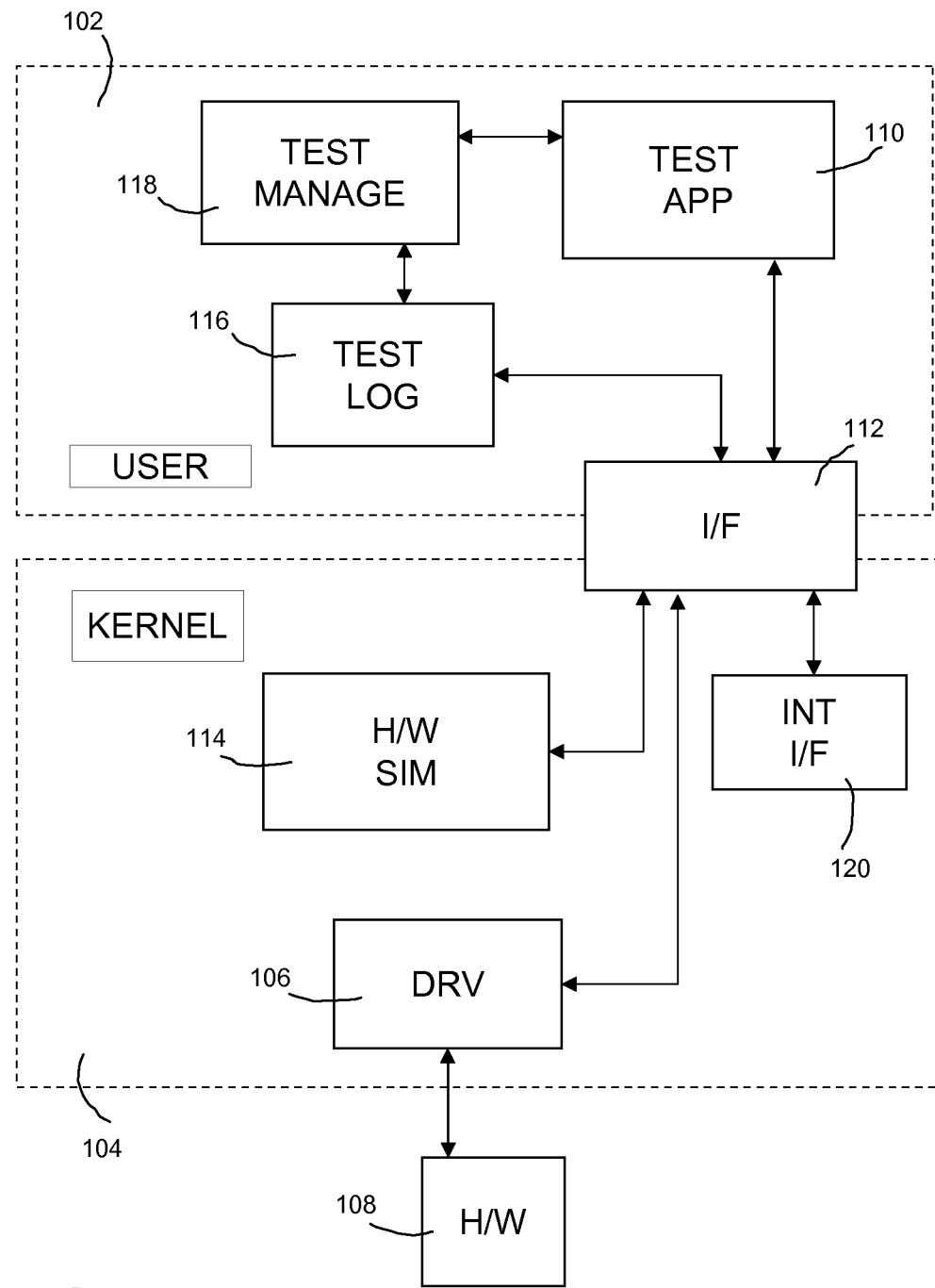
FIG. 2 is a block schematic diagram of an embodiment of a system for linking a test application to one or more hardware device interfaces.

FIG. 2 is an exemplary embodiment of functional features of a computer system according to the present invention. As shown, the computer memory is divided into user address space 102 and kernel address space 104. This division is a well-known arrangement in a number of operating systems such as Windows® and need not be described in greater detail. Within the kernel address space 104 a first software component is an interface in the form of a hardware device driver 106 which links to an external hardware device 108 (such as the mouse 22 or keyboard 24 of FIG. 1). Although only a single interface component 106 and hardware device 108 are shown, it will be readily understood that there may be a plurality of these. Also shown within the kernel space 104 is an internal hardware interface 120 which links to an internal device such as coprocessor 42 (FIG. 1).

In order to test the operation of the system, a test application 110 is provided operating in user address space 102, which test application typically comprises an extensive suite of discrete test processes each designed to test respective and different aspects of the system operation. To enable the test application 110 to determine the effect of each test process on the hardware supported by the system, it is necessary to provide a link between the test application 110 in user address space 102 and the hardware interface 106 in the generally protected kernel address space 104 and to this end a linking interface module 112 is provided to enable controlled access to the kernel address space. The particular form of the linking interface module 112 is not relevant to the present invention and will not be further described: an example of such a linking interface is described in the above-referenced U.S. Pat. No. 7,181,382B2 (Shier et al). In an alternative arrangement (not shown), the or each device driver 106 and internal hardware interface 120 includes interface functionality which bridges user and kernel address space and links directly to the test application 110 and test log 116, thereby removing the need for separate interface module 112.

The test application 110 may be pre-loaded as a part of the operating system or it may be loaded up later as required, for example by use of a computer-readable medium such as the optical or magnetic disc 34 of FIG. 1.

As will be readily understood, it is not always practicable or desirable to have any or all of the hardware devices supported by the system actually connected thereto during testing. To facilitate this, a hardware device simulator module 114 may be provided in kernel address space 104 to enable the test application 110 to interact with a computer simulation of a supported hardware device rather than an actual device. This is of particular value for bulky repetitive test operations such as testing response to each possible keystroke or combination of keystrokes that may be input via a keyboard (24, FIG. 1).

In order to support the present invention in improving the efficiency of the software test process, two further modules are provided in user address space 102 and linked to the test application 110. The first of these is a test log 116 which records the result of each of the discrete test processes. The second of these is a test management function 118 which, by reference to the test log 116, causes or enables a rearrangement of the order of running of the discrete test processes by the test application 110 such as improve the efficiency of operation according to predetermined criteria as will be discussed further below.

In order to determine which physical parts of the system that a test affects (interacts with), the present invention may use privileged code to access the kernel address space of the memory. As each hardware device interface includes respective features defined in kernel address space, by monitoring the appropriate regions of the kernel address space the hardware devices utilised or affected by each test may be determined. Typical regions or locations that may be monitored include those relating to data registers or control registers or DMA (direct memory access) initiations in which hardware devices or subsystems access memory independently of the CPU.

Figure 3:
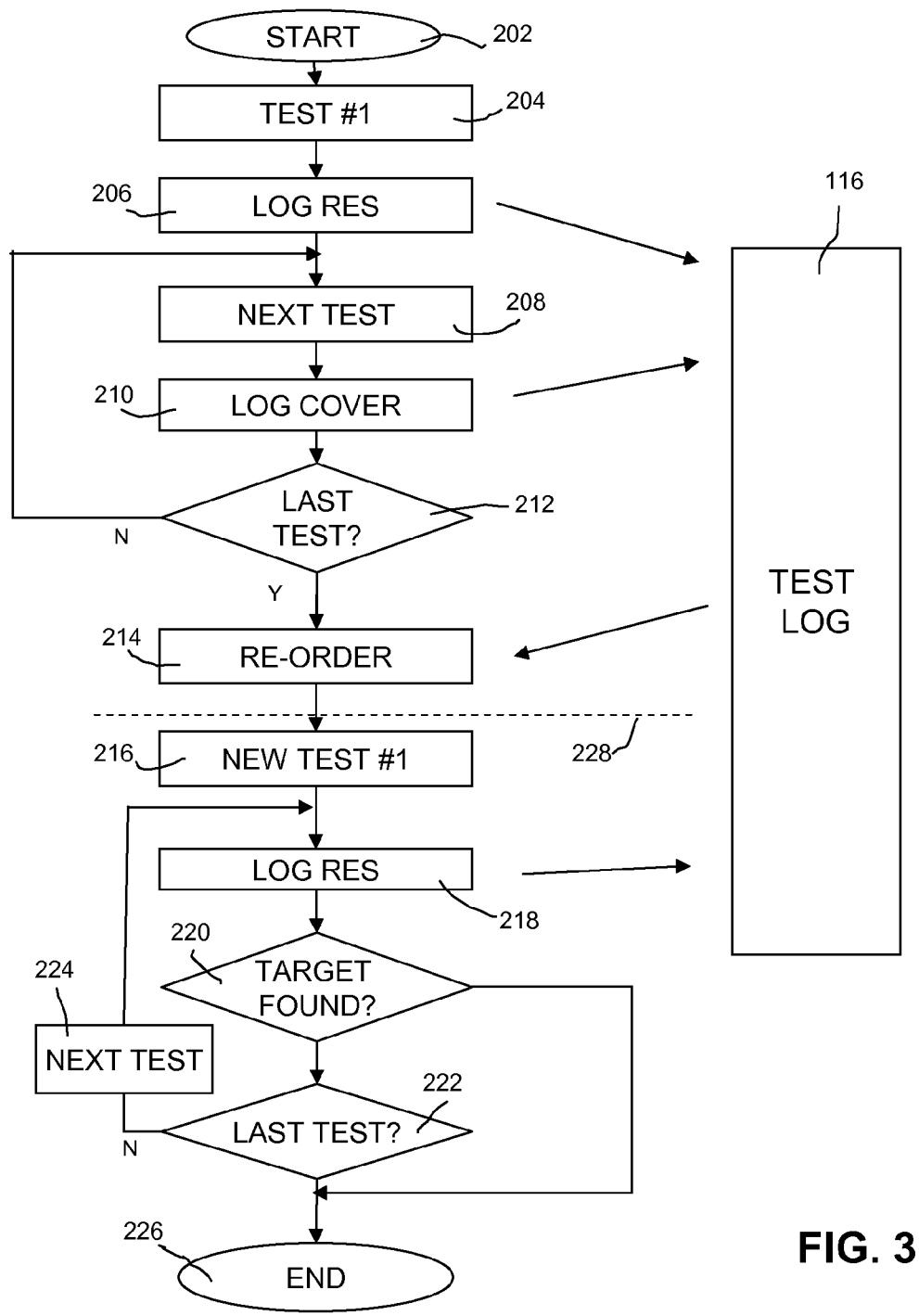
FIG. 3 is a flow diagram illustrating an exemplary embodiment of a method according to the invention.

FIG. 3 is a flow chart illustrating a method embodying the present invention for testing a computer system such as described above with reference to FIGS. 1 and 2. The method starts at step 202 with the initiation of the test application, which application comprises a suite of discrete test processes arranged in a first order of implementation. Following initiation, the first discrete test process (according to the order of implementation) is carried out at step 204. At step 206, the result of that first test process is logged, as will be described in greater detail below with reference to FIG. 5. At step 208 the method proceeds to selecting and carrying out the next test process in the first order of implementation. At step 210 a check is made as to whether all steps of the first order have been completed and, if not, the process reverts to step 208 for selection and implementation of the next un-implemented process.

If step 212 indicates that the full suite of test processes has been implemented, the method proceeds to step 214 where the discrete test processes are rearranged into a second order of implementation, which second order is derived from analysis of the logged test results.

At step 216 begins the re-run the discrete test processes, this time in the second order of implementation, beginning with the first test process specified in the second order. At step 218, the results of the re-run test are logged and the process moves to decision step 220.

It is a key feature of the present invention that it enables enhanced efficiency in the testing process, and this is particularly achieved where a desired result is sought during running of the second order. One example of a desired result is ascertaining the trigger for a particular instance of hardware device operation, especially an error had previously been determined for that operation. By having a second order of implementation in which all test processes which cover that particular hardware device are the first to be scheduled, the continued existence of an error or an assurance as to its removal may be more swiftly determined than by simply repeating the first order. Decision step 220 enhances this feature by leading directly to termination 226 of the running of the second order if the target or desired result is detected, thereby avoiding unnecessary delay whilst further (redundant) test processes are carried out.

If step 220 does not determine that the target or desired result is detected, the method moves to step 222 where a check is made as to whether the last test in the second order has been performed. If so, the method terminates at 226: if not, the method proceeds to step 224 where the next process in the second order is selected and implemented, returning to step 218 where the result of that implementation is logged.

As will be understood, and as represented by break line 228, the running of the second order of implementation need not follow immediately on completion of the step 214 of re-ordering of the test processes. Indeed it is likely that there will be an interruption as errors or issues indicated by the test processes in the first order running are addressed before retesting. There may alternatively or additionally be a break (not shown) introduced before the step 214 of re-ordering to enable issues addressed before retesting to influence the reordering operation. For instance, if the running in the first order indicates issues with more than one hardware device or operation, it may be desirable or necessary to address only one such device or operation before retesting or, if multiple issues are addressed, there may be determined an optimum order for retesting, which will be reflected in the second order.

From the foregoing it will be appreciated that there are a number of different ways in which the step 214 of re-ordering may be carried out, deriving the second order of performance from the recorded/logged hardware device interactions. One such method is now described with reference to the flow diagram of FIG. 4 and example test log entries in the table of FIG. 5.

The re-ordering process starts at step 302 with the selection of a hardware device (actual or modelled in simulation) which will have been involved in one or more of the discrete test processes carried out in the first order of performance. This selection will direct the derivation of at least a part of the second order of performance. As will be described below, selection of more than one hardware device is also supported. The next step 304 is to access the test log 116 (FIGS. 2, 3) to enable analysis of the results of the individual discrete test processes of the first order.

The table of FIG. 5 schematically represents exemplary test log data in a table having four columns. The first column contains an identifier for the individual discrete test process, the second column contains respective identifiers for each hardware device under consideration, the third column contains a flag indicating whether or not the device indicated in column 2 has been involved in the test process identified in column 1, and the fourth column contains test result data. As shown, each row in the table represents a different combination of discrete test process and hardware device under consideration. For the purposes of illustration, 256 discrete tests in a system having three hardware devices are represented, with 8-bits of binary data specifying the test result, which numbers may vary depending on the extent of the test application and complexity of the system under test.

It will be readily understood that there are many alternatives for the format in which the test log data is stored. For example, the number of rows may be reduced, and the third column removed, if only those devices affected by specific tests are logged. Furthermore, the second column may be dispensed with if the test results in column 4 identify the hardware device, possibly as a simple numerical identifier in the first or last four bits.

Figure 4:
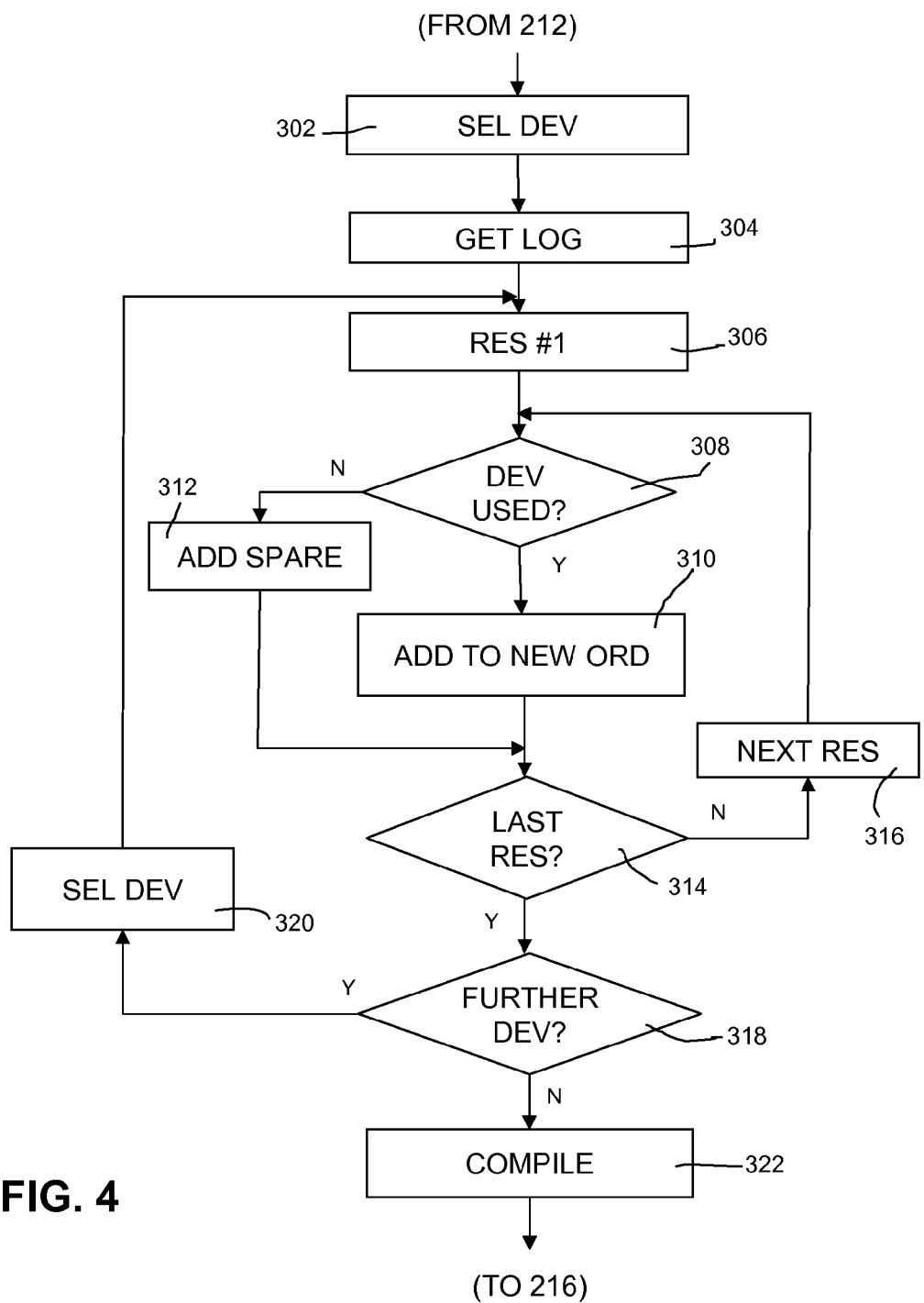
FIG. 4 is a flow diagram illustrating an exemplary embodiment of one of the process steps of FIG. 3.

Reverting to FIG. 4, following accessing of the test log data at 304 the analysis of the data begins at step 306 with the result of the first discrete test being selected. At step 308 a determination is made as to whether the device selected at step 302 is affected by the first test: in the table of FIG. 5 this would comprise finding the identifier for the selected device in column 2 and checking the flag in column 3. If the analysis at step 308 does not show the selected device to be affected by the first discrete test then at step 312 that test is added to a spares list (described below) and the process continues to step 314. If the analysis at step 308 does show the selected device to be affected by the first discrete test then at step 310 that first test is placed in first position in the second order of performance. At step 314 a check is made as to whether the results of all tests have been analysed and, if not, at step 316 the next test result is selected from the table and the process reverts to step 308. This time, if the determination of step 308 shows the test under consideration to affect the selected device, then at step 310 the test under consideration is placed in the next available position in the second order of performance. By repeating the loop of steps 308, 310, 314 and 316 until step 314 indicates that the last result has been analysed, the n tests from the first order of performance which affect the selected device will occupy the first n positions in the second order of performance.

As mentioned above, the process may support the analysis based on more than one selected hardware device. In the example of FIG. 4, the respective selected devices are handled sequentially, with the process continuing until step 314 determines that the last test has been analysed for the first selected device at which point step 318 determines whether there is a further device to form the basis for the analysis. If so, then at step 320 that further device becomes the selected device and step 306 and the loop of steps 308, 310, 314 and 316 are performed until step 314 again indicates that the last test result from the first order of performance has been analysed. This time the m tests from the first order of performance which affect the second selected device will occupy the next m positions in the second order of performance following the n tests from the first selected device.

When step 318 indicates that there are no further devices to analyse as the selected device, the process moves to step 322 in which the final second order of performance is compiled. In the simplest scheme this would comprise the succession of tests added at step 310 for each selected device, followed by the remainder of the tests from the first order of performance which were added to the spares list at step 312. In more complex arrangements, some or all of the discrete tests may be identified with respective priority levels and those tests from the first order of performance which affect a particular selected device and occupy a sequential block of positions in the second order of performance may be re-ordered within that sequential block according to priority level. Manual intervention by a system user to move individual tests within the second sequence is also supported.

A further step during compilation may comprise removal of duplicate entries. These may occur where there is more than one selected device and an individual test is identified as affecting two or more such selected devices. In such circumstances it is preferred to retain the instance of the test that is highest placed in the second order of performance and discard those below.

On completion of the compilation of the second order at step 322, the process reverts to step 216 of FIG. 3, optionally following a break point 228 as described above.

Variations in the process of re-ordering are of course possible. For example, where there are plural selected devices then, rather than handling them sequentially, they may be handled as a group. In such a case step 302 would involve the selection of multiple devices together and the loop of steps 318 and 320 may be discarded. The outcome would be that those tests relating to any of the selected devices would appear in the same (possibly interleaved) order in the second performance order as in the first, albeit with those tests not related to any selected device having been stripped out and moved down the order via the spares list as described above with reference to step 312. In this arrangement, the granularity of focus on individual selected devices may be lost, but the incidence of duplicate entries requiring clearing at the compilation stage 322 is reduced.

Whilst embodiments of the present invention have been described above, the technical scope of the invention is not limited to the scope of the above-described embodiments. It should be apparent to those skilled in the art that various changes or improvements can be made to the embodiments. It is apparent from the description of the appended claims that implementations including such changes or improvements are encompassed in the technical scope of the invention.

The invention claimed is:

1. A method for testing a computer system, which system includes an interface supporting connection to one or more hardware devices, comprising the steps of:
    performing a first test which tests operation of said computer system, said first test being performed by performing a plurality of discrete software test processes in a first order of performance;
    for each test process of said plurality of discrete software test processes, by reference to said interface, recording the hardware device interactions occasioned by the respective test process;
wherein the method further comprises:
    subsequently performing a second test which tests operation of said computer system, said second test being performed by performing at least some of said test processes in a second order of performance different from said first order of performance, which second order is derived from said recording of hardware device interactions.

2. A method as claimed in claim 1, wherein said plurality of discrete software processes are directed by a test application operating in user address space of said computer system and said hardware device interactions are detected from monitoring activity in kernel address space of said computer system.

3. A method as claimed in claim 2, wherein the or each hardware device is associated with one or more respective specific locations in kernel address space and the step of recording the hardware device interactions comprises logging accesses to the or each of said one or more specific locations.

4. A method as claimed in claim 1, wherein the step of recording the hardware device interactions for each test process further comprises determining and recording a respective coverage value representing the extent of hardware device interactions.

5. A method as claimed in claim 4, wherein said second order of performance comprises a schedule of said test processes in order from greatest to lowest respective coverage values.

6. A computer system comprising:
    a processor;

a memory connected to said processor and storing operating instructions for said processor;

an interface coupled with said processor and supporting connection to one or more hardware devices;

at least one software testing component storable in said memory and executable on said processor, said at least one software testing component:

performing a first test which tests operation of said computer system, said first test being performed by performing a plurality of discrete software test processes in a first order of performance;

recording in said memory for each test process of said plurality of discrete software test processes, by reference to said interface, the hardware device interactions occasioned by the respective test process;

determining a second order of performance for said software test processes different from said first order of performance, which second order is derived from said recording of hardware device interactions; and subsequently performing a second test which tests operation of said computer system, said second test being performed by performing at least some of said test processes in said second order of performance.

7. A system as claimed in claim 6, wherein said plurality of discrete software test processes performed by said processor are directed by a test application operating in user address space, wherein the or each hardware device to which connection is supported is associated with one or more respective specific locations in kernel address space, and said processor is configured to record said hardware device interactions by logging accesses to the or each of said one or more respective specific locations in kernel address space of said computer system.

8. A system as claimed in claim 7, wherein said interface supporting connection to one or more hardware devices comprises a discrete interface module associated with each hardware device supported.

9. A system as claimed in claim 7, wherein said interface supporting connection to one or more hardware devices comprises an interface to one or more hardware device simulations modelled in kernel address space.

10. A non-transitory computable-readable medium containing computer-readable instructions which, when executed by a computer system performs a method of testing a computer system, which system includes an interface supporting connection to one or more hardware devices, comprising the steps of:

performing a first test which tests operation of said computer system, said first test being performed by performing a plurality of discrete software test processes in a first order of performance;

for each test process of said plurality of discrete software test processes, by reference to said interface, recording the hardware device interactions occasioned by the respective test process;

wherein the method further comprises:

subsequently performing a second test which tests operation of said computer system, said second test being performed by performing at least some of said test processes in a second order of performance different from said first order of performance, which second order is derived from said recording of hardware device interactions.

11. A non-transitory computer-readable medium as claimed in claim 10, wherein said plurality of discrete software processes are directed by a test application operating in user address space of said computer system and said hardware device interactions are detected from monitoring activity in kernel address space of said computer system.

12. A non-transitory computer-readable medium as claimed in claim 11, wherein the or each hardware device is associated with one or more respective specific locations in kernel address space and the step of recording the hardware device interactions comprises logging accesses to the or each of said one or more specific locations.

13. A non-transitory computer-readable medium as claimed in claim 10, wherein the step of recording the hardware device interactions for each test process further comprises determining and recording a respective coverage value representing the extent of hardware device interactions.

14. A non-transitory computer-readable medium as claimed in claim 13, wherein said second order of performance comprises a schedule of said test processes in order from greatest to lowest respective coverage values.

* * * * *